United States Patent
Park et al.

(12) 
(10) Patent No.: US 6,960,971 B2
(45) Date of Patent: Nov. 1, 2005

(54) MICROELECTRO MECHANICAL SYSTEM SWITCH

(75) Inventors: Young-jun Park, Kyungki-do (KR); In-sang Song, Seoul (KR); In-taek Han, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 34 days.

(21) Appl. No.: 10/706,106

(22) Filed: Nov. 13, 2003

(65) Prior Publication Data
US 2004/0173872 A1 Sep. 9, 2004

(30) Foreign Application Priority Data
Nov. 18, 2002 (KR) .................... 10-2002-0071609

(51) Int. Cl.[7] .............................. H01P 1/10; B81B 7/02
(52) U.S. Cl. ...................................... 333/262; 200/181
(58) Field of Search .................................... 333/105, 258, 333/262; 200/181

(56) References Cited

U.S. PATENT DOCUMENTS

| | | | |
|---|---|---|---|
| 5,619,061 A | 4/1997 | Goldsmith et al. | |
| 6,621,022 B1 * | 9/2003 | Ma et al. | 200/267 |
| 6,686,820 B1 * | 2/2004 | Ma et al. | 333/262 |
| 6,753,582 B2 * | 6/2004 | Ma | 257/415 |
| 6,753,747 B2 * | 6/2004 | Ma | 335/83 |
| 6,794,101 B2 * | 9/2004 | Liu et al. | 430/48 |

* cited by examiner

*Primary Examiner*—Dean Takaoka
(74) *Attorney, Agent, or Firm*—Buchanan Ingersoll PC

(57) ABSTRACT

Provided is a microelectro mechanical system (MEMS). The provided MEMS switch includes a substrate; a signal line formed on the substrate; a beam deformed by an electrostatic force to electrically switch with the signal line; and a spring type contact unit formed on the signal line to electrically contact the beam and elastically deformed by an external force. Thus, stability of the contact between the contact unit and the beam is improved. In particular, even when the beam or the contact unit under the beam is unbalanced, the contact unit can elastically contact the beam to obtain a stable electrical switching operation.

18 Claims, 18 Drawing Sheets

US 6,960,971 B2

MICROELECTRO MECHANICAL SYSTEM SWITCH

BACKGROUND OF THE INVENTION

This application claims the priority of Korean Patent Application No. 2002-71609, filed on Nov. 18, 2002, in the Korean Intellectual Property Office, which is incorporated herein in its entirety by reference.

1. Field of the Invention

The present invention relates to a microelectro mechanical system (MEMS) switch, and more particularly, to an MEMS switch that prevents switching elements from sticking and performs a stable switching operation.

2. Description of the Related Art

Radio frequency (RF) switches are a representative example of MEMS devices. RF switches are commonly used for signal routing and impedance matching in wireless communication terminals and microwave or millimeter wave band systems.

RF MEMS switches are mainly divided into capacitive switches and ohmic switches, and various types of RF MEMS switches are disclosed in U.S. Pat. No. 5,619,061.

FIG. 1 is a sectional view illustrating the structure of a conventional ohmic RF MEMS switch.

Referring to FIG. 1, spacers 2 having a predetermined height are formed at both sides of a substrate 1. The spacers 2 support conductive beams, for example, metal beam 6 located on the substrate 1. A contact plate 7 is attached to the lower surface of the beam 6 whose sides are supported by the spacers 2. A signal line 3 is formed on the substrate 1 to correspond to the contact plate 7, and RF grounds 4 are formed at both sides of the signal line 3. Insulating layers 5, formed of a dielectric material, are formed on the RF grounds 4 to prevent the beam 6 and the RF grounds 4 from directly contacting.

When a predetermined direct current (DC) voltage is applied between the beam 6 and the RF grounds 4, the beam 6 is attached to the insulating layers 5 by the electrostatic force between the beam 6 and the RF grounds 4. In this case, the contact plate 7 formed under the beam 6 contacts the signal line 3, so an RF signal passes through an electric path between the beam 6 and the signal line 3.

FIG. 2 is a sectional view illustrating the structure of a conventional capacitive RF MEMS switch.

The conventional capacitive RF MEMS switch shown in FIG. 2 operates according to an electrostatic force between a signal line 3a and a beam 6a. Here, an insulating layer 5a is formed under the beam 6a in order to prevent the loss of electrostatic force due to the direct contact between the signal line 3a and the beam 6a.

When a predetermined DC voltage is applied between the signal line 3a and the beam 6a, the beam 6a contacts the upper surface of the signal line 3a due to the electrostatic force between the signal line 3a and the beam 6a. Accordingly, a capacitance between the beam 6a and the signal line 3a is largely increased so that the beam 6a and the signal line 3a reach an "ON" state. Here, since the insulating layer 5a, which prevents an electric short, is located between the beam 6a and the signal line 3a, the beam 6a and the signal line 3a maintain the "ON" state as long as the DC voltage is applied between the beam 6a and the signal line 3a. Thus, RF signals passes through the beam 6a and the signal line 3a. An RF blocking filter, such as a resistor or a chalk, is arranged in a DC power source, which generates a switching operation, in order to prevent the input of the RF signals. In addition, a DC blocking unit, such as a capacitor, is arranged in the RF signal path in order to prevent the input of the DC voltage from the DC power source.

The signal lines and the beams of the above-described switches contact each other as shown in FIG. 1. However, if the signal line and the beam do not completely contact each other by some reasons, the switching operation becomes unstable due to the unstable physical contact between the signal line and the beam. Thus, the beam should be formed parallel with the substrate or the surface of the signal line.

Referring to FIG. 3, in the case where two separate signal lines 3b electrically connect a beam 6b, if the beam 6b is not parallel with a substrate 1 or the signal lines 3b, the switching operation becomes unstable or the switching operation fails.

The conventional RF MEMS switch is manufactured by forming an RF blocking element, signal lines, and insulating layers using layer formation processes and etching processes. In addition, the RF MEMS switch is manufactured by forming a sacrificial layer, forming a structural layer, and then removing the sacrificial layer. The signal lines are formed by performing a photolithography process and an etching process, such as dry or wet etching. Since the signal lines are near from a moving structure, i.e., the beam, located above the signal lines, the beam and the signal lines may be stuck together due to an etchant, which is used to form the RF MEMS switch.

SUMMARY OF THE INVENTION

The present invention provides a microelectro mechanical system (MEMS) switch, which performs a stable switching operation and prevents a beam from sticking to a signal line when manufacturing the MEMS switch, and a manufacturing method thereof.

According to an aspect of the present invention, there is provided an MEMS switch comprising a substrate; a signal line formed on the substrate; a beam deformed by an electrostatic force to electrically switch with the signal line; and a spring type contact unit formed on the signal line to electrically contact the beam and elastically deformed by an external force.

It is preferable that the contact unit is formed in a curved shape. In the embodiments of the present invention, the contact unit is formed into an arch shape or a dome shape having end units.

It is preferable that a through hole is formed at a top portion of the arch shape or the dome shape contact unit.

According to another aspect of the present invention, there is provided an MEMS switch comprising a substrate; first and second signal lines formed on the substrate while the ends of the signal lines are adjacent; a beam deformed by electrostatic force to electrically contact the first and second signal lines; and spring type contact units arranged at both ends of the signal lines to electrically connect to the beam and electrically deformed by an external force.

It is preferable that the contact units are formed in a curved shape.

In the MEMS switches according to the present invention, the beam is located above the contact units. In addition, the beam is formed in a simply-supported beam shape where both ends of the beam are fixed on the substrate, a cantilever shape where the beam has a fixed end and a free end, or a membrane shape where a portion or the entire portion corresponding to the contact units is fixed to the substrate.

BRIEF DESCRIPTION OF THE DRAWINGS

The above objectives and advantages of the present invention will become more apparent by describing in detail preferred embodiments thereof with reference to the attached drawings in which.

DETAILED DESCRIPTION OF THE INVENTION

The present invention will now be described more fully with reference to the accompanying drawings, in which preferred embodiments of the invention are shown. Here, descriptions of a technology well known to skilled in the art or the elements not shown in the detailed description will be omitted.

Figure 1:
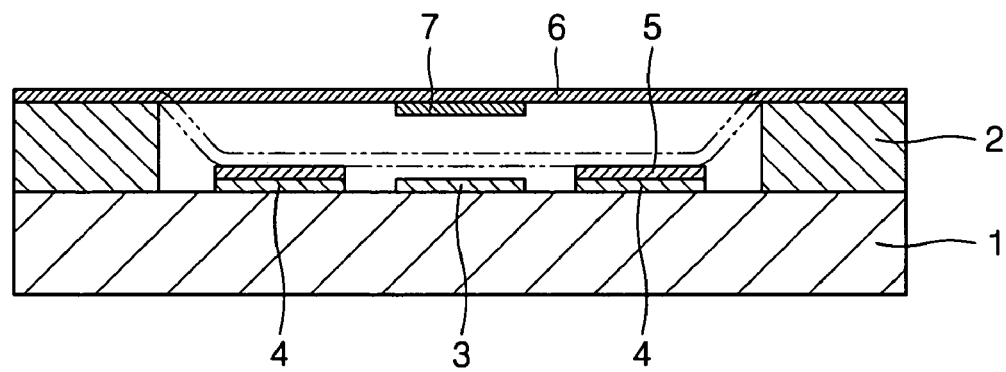
FIG. 1 is a sectional view illustrating a conventional microelectro mechanical system (MEMS) switch.
Figure 2:
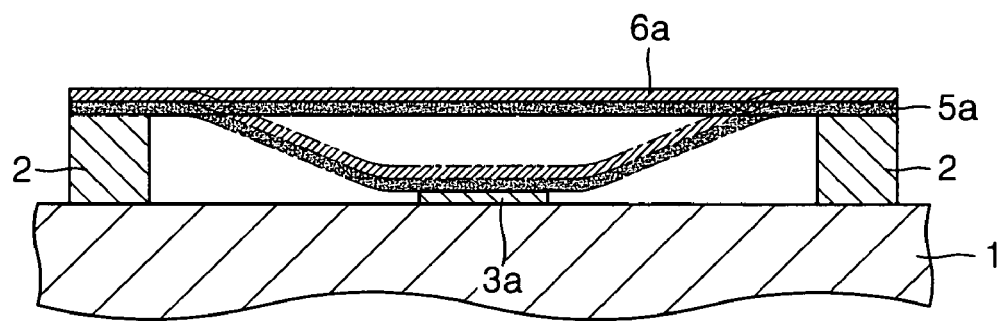
FIG. 2 is a sectional view illustrating another conventional MEMS switch.
Figure 3:
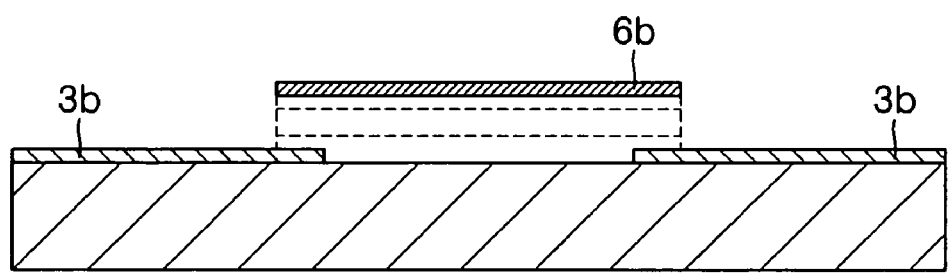
FIG. 3 is a sectional view illustrating a conventional relay MEMS switch.
Figure 4:
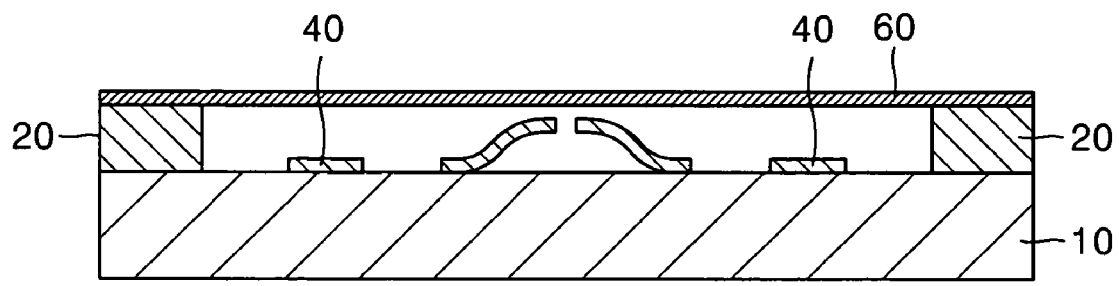
FIG. 4 is a sectional view illustrating an MEMS switch according to a first embodiment of the present invention.
Figure 5:
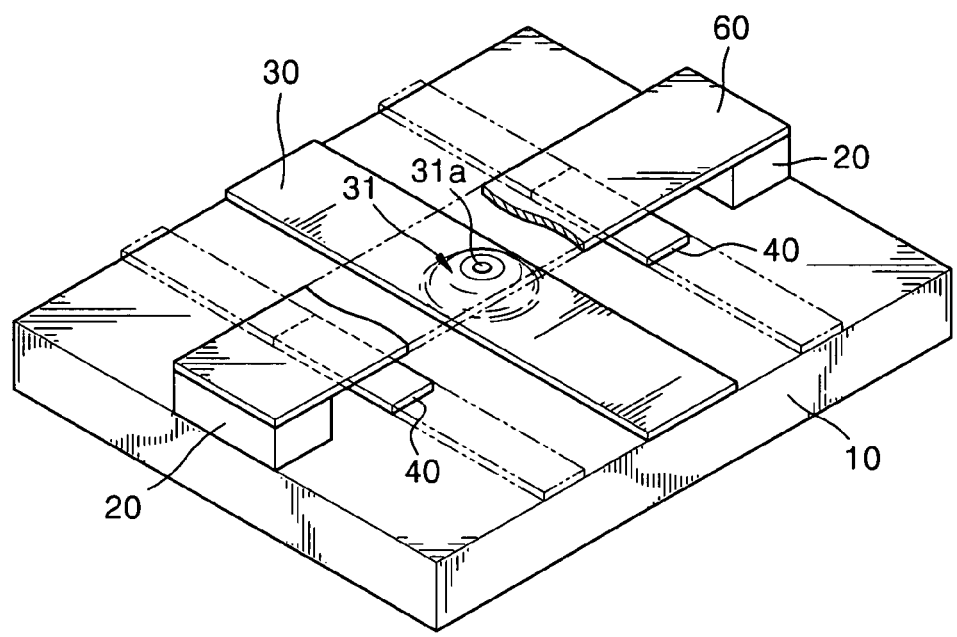
FIG. 5 is a perspective view illustrating the MEMS switch of FIG. 4.

FIG. 4 is a sectional view and FIG. 5 is a perspective view illustrating a microelectro mechanical system (MEMS) switch according to a first embodiment of the present invention.

Referring to FIGS. 4 and 5, a stripped signal line 30 having a dome-shape contact unit 31 is formed at the upper center of a substrate 10. An operating beam 60, which is fixed in a simple beam or simply-supported beam type by spacers 20, is located above the dome-shape contact unit 31. A through hole 31a is formed at the top of the dome-shape contact unit 31. Beam driving electrodes 40 that generate an electrostatic force and pull the beam to contact the beam 60 to the dome-shape contact unit 31 are formed at both sides of the signal line 30. Here, the beam driving electrodes 40 can be used as grounds, which are required to wave guide RF signals. Accordingly, it is preferable that the beam driving electrodes 40 extend to be parallel with the signal lines 30 as shown in FIG. 5 using dotted lines.

Figure 6:
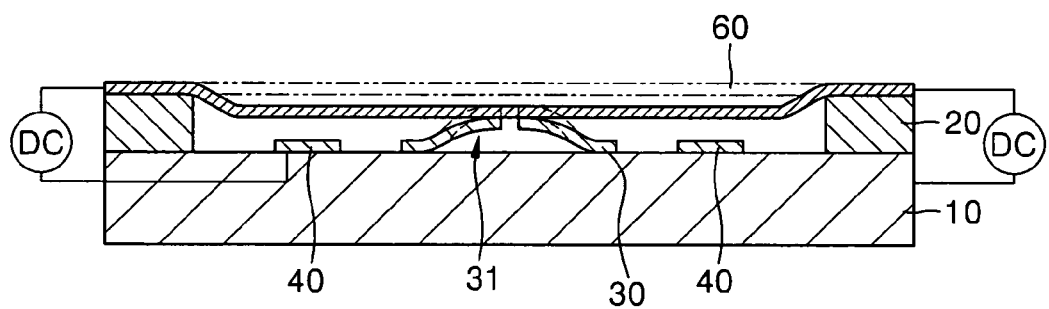
FIG. 6 is a sectional view for explaining the operation of the MEMS switch of FIG. 4.

Referring to FIG. 6, when a DC voltage is applied between the beam 60 and the driving electrodes 40, a charge occurs between the beam 60 and the driving electrodes 40 so that the beam 60 is attracted toward the substrate 10 due to an electrostatic force. Accordingly, the central portion of the beam 60 contacts a dome-shape contact unit 31. Thus, a portion of the dome-shape contact unit 31 is elastically deformed by the force applied to the beam 60, so an ohmic contact occurs. Such ohmic contact occurs with an elastic deformation that allows the RF signals to stably flow. Here, the through hole 31a of the dome-shape contact unit 31 adds flexibility when elastically deforming the dome-shape contact unit 31. Accordingly, when the through hole 31a is not formed, the stiffness of the dome-shape contact unit 31 improves.

In this case, the beam 60, the signal line 31, and the driving electrodes 40 are formed of a conductive material, and the ohmic contact occurs between the beam 60 and the signal line 31. In general, the distance between the beam 60 and the substrate 10 is about 3 microns, and the height of the dome-shape contact unit 31 is about 2 microns. In addition, the thickness of the beam driving electrodes 40 at both sides of the signal line 60 is about thousands of A. Thus, when the electrodes 40 and the beam 60 are charged and the beam 60 is deformed due to the electrostatic force as shown in FIG. 6, the beam 60 contacts the dome-shape contact unit 31, and the electrodes 40 and the beam 60 are separated by an air layer therebetween. Thus, a separate dielectric layer is not required between the electrodes 40 and the beam 60.

Figure 6A:
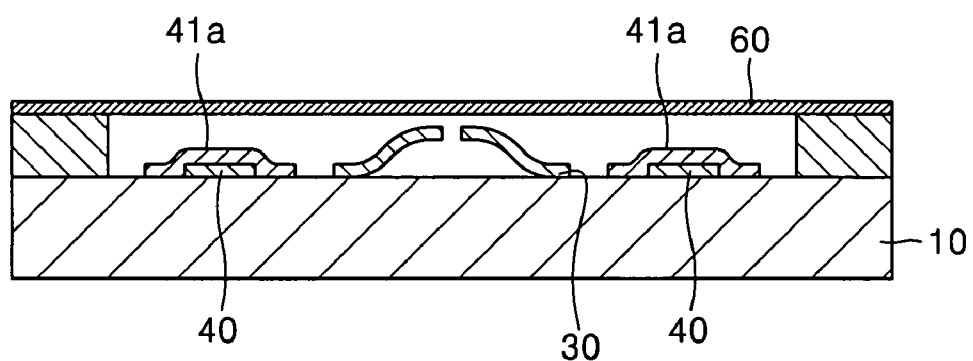
FIG. 6A is a sectional view illustrating an MEMS switch according to a second embodiment of the present invention.
Figure 6B:
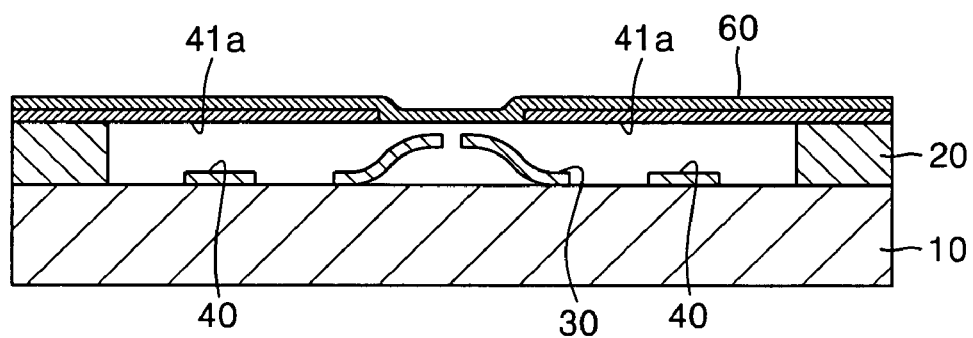
FIG. 6B is a sectional view illustrating an MEMS switch according to a third embodiment of the present invention.

However, dielectric layers 41a can be formed on electrodes 40 as shown in FIG. 6A in order to completely prevent the ohmic contact between the electrodes 40 and a beam 60. In other case, dielectric layers 41b can be formed on the lower surface of a beam 60 except for a central portion corresponding to a dome-shape contact unit 31, as shown in FIG. 6B.

In addition, although the ohmic contact may occur between the beam 60 and the contact unit 31, a dielectric layer can be formed on the contact unit 31 or under the beam 60 corresponding to the contact unit 31 to generate a capacitive contact.

Descriptions of an RF blocking unit, such as an RF blocking resistor or a chalk used in an RF MEMS switch, for blocking the input of RF signals to DC circuits, and a DC blocking unit, such as a capacitor, for blocking the input of RF signals to the RF circuits will be omitted.

Figure 7:
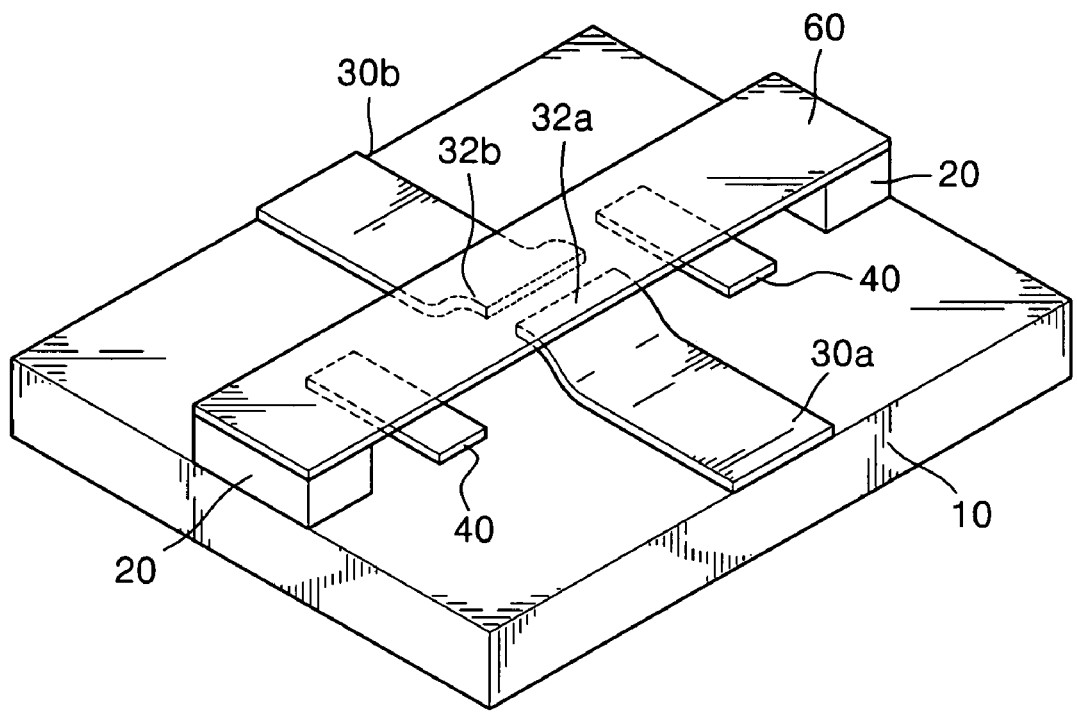
FIG. 7 is a perspective view illustrating an MEMS switch according to a fourth embodiment of the present invention.
Figure 8:
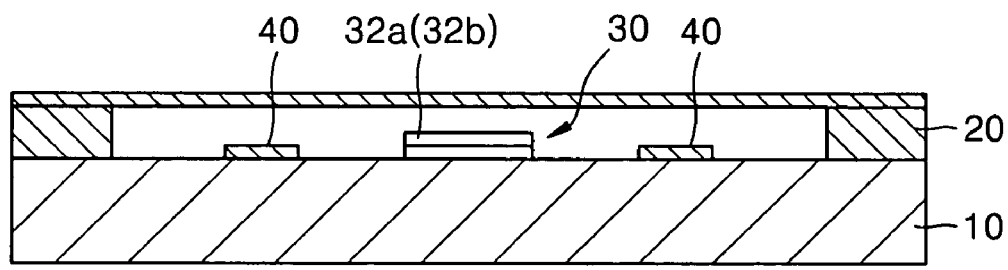
FIG. 8 is a sectional view illustrating the MEMS switch of FIG. 7.
Figure 9:
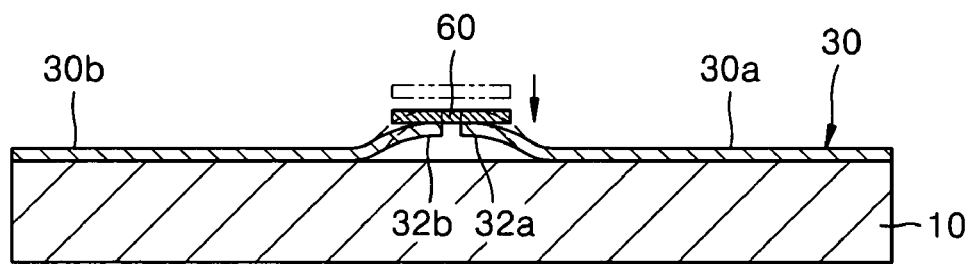
FIG. 9 is a sectional view for explaining the operation of the MEMS switch of FIG. 7.

FIGS. 7 through 9 illustrate the structure of an MEMS switch according to another embodiments of the present invention. Referring to FIGS. 7 through 9, in relay type switches according to the present invention, a signal line 30 is separated into an input unit 30a and an output unit 30b which have curved contact units 32a and 32b, respectively. Here, the curved contact units 32a and 32b are curved while facing each other so that the curved contact units 32a and 32b are formed as flip springs. In addition, a beam 60 is formed above the contact units 32a and 32b.

Thus, when a DC voltage is applied between beam driving electrodes 40 and the beam 60, the beam 60 is attracted toward a substrate due to an electrostatic force, and the beam 60 contacts the contact units 32a and 32b, as shown in FIG. 9. Here, the contact units 32a and 32b are elastically deformed and attached to the beam with a proper pressure, so an ohmic contact occurs. Thus, the input unit 30a and the output unit 30b of the signal line 30 are electrically connected.

In this case, even when the beam 60 inclines to one side while not being parallel with the contact units 32a and 32b of the input unit 30a and the output unit 30b, or even when the contact units 32a and 32b of the input unit 30a and the output unit 30b are unbalanced, a stable ohmic contact may occur due to the elastic deformation of the contact units 32a and 32b.

Figure 8A:
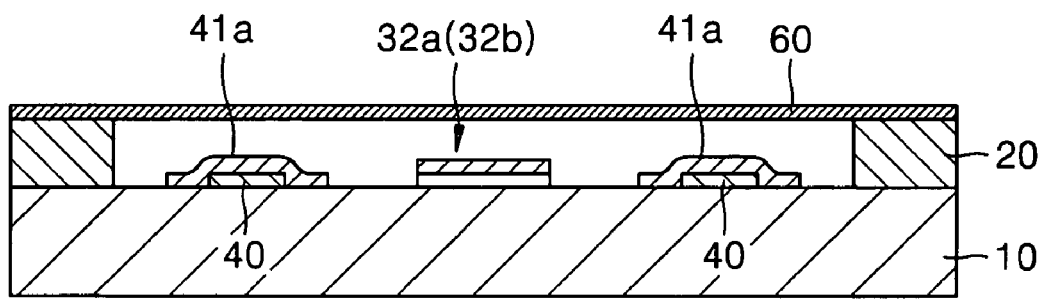
FIG. 8A is a sectional view illustrating an MEMS switch according to a fifth embodiment of the present invention.
Figure 8B:
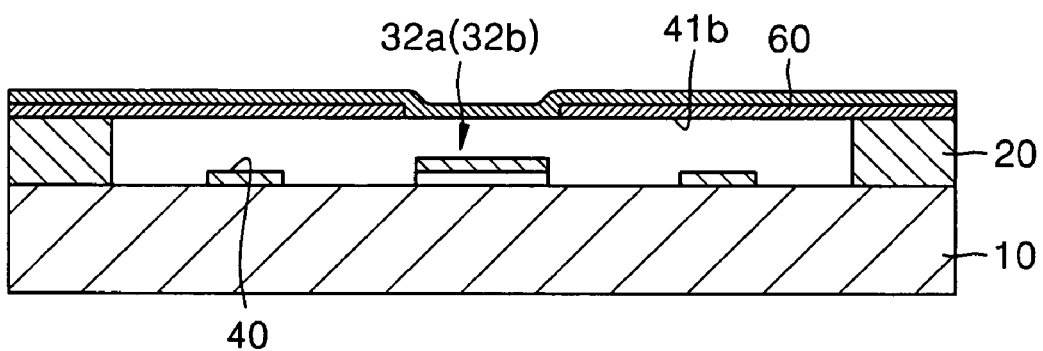
FIG. 8B is a sectional view illustrating an MEMS switch according to a sixth embodiment of the present invention.

In order to completely prevent the ohmic contact between the electrodes 40 and the beam 60, dielectric layers 41a can be formed on the electrodes 40, as shown in FIG. 8A, or dielectric layers 41b can be formed under the beam 60 except for the central portion corresponding to the contact units 32a and 32b, as shown in FIG. 8B.

Figure 10:
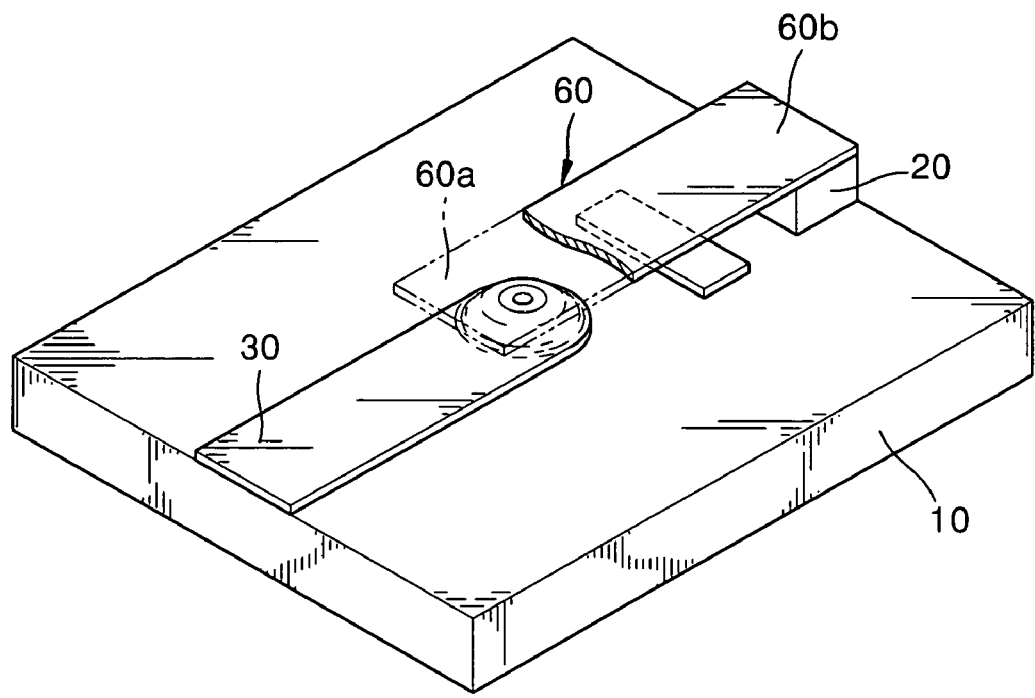
FIG. 10 is a perspective view illustrating an MEMS switch according to a seventh embodiment of the present invention.
Figure 11:
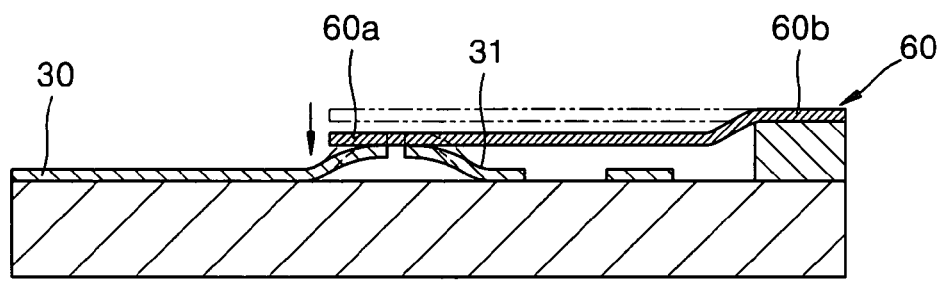
FIG. 11 is a sectional view for explaining the operation of the MEMS switch of FIG. 10.

FIGS. 10 and 11 illustrates an RF MEMS switch according to still another embodiment of the present invention.

In this case, one end of a beam 60 is fixed while freeing the other end of the beam 60 so that the beam 60 is formed as a cantilever. In addition, only one beam driving electrode 40 is formed in the RF MEMS switch. Referring to FIGS. 10 and 11, a stripped signal line 30 having a dome-shape contact unit 31 is formed on an upper center of a substrate 10. A free end 60a of the beam 60 is located above the dome-shape contact unit 31. A fixed end 60b of the beam 60 is supported by a spacer 20, which is fixed on the substrate 10. The beam 60 and the signal line 30 are located on a predetermined straight line, and the free end 60a located at the end of the beam 60 and the dome-shape contact unit 31 located at the end of the signal line 30 are overlapped each other. Here, the signal line 30 and the beam 60 may be arranged to cross each other. The beam driving electrode 40, which drives the beam 60, is located between the dome-shape contact unit 31 and the spacer 20. In this case, the location and the number of the beam driving electrode 40 can be changed.

Figure 12:
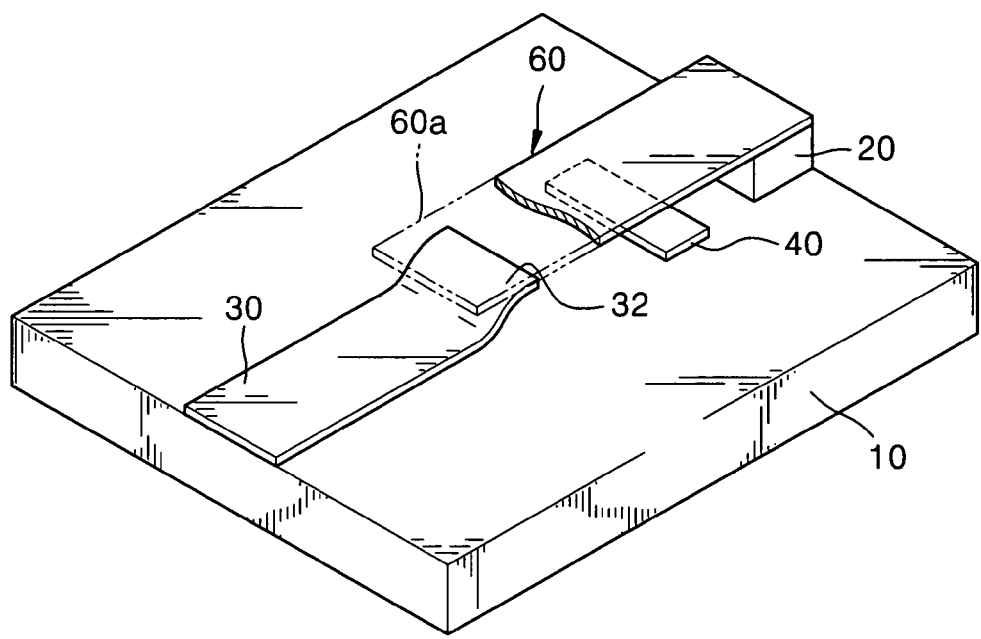
FIG. 12 is a perspective view illustrating an MEMS switch according to an eighth embodiment of the present invention.
Figure 13:
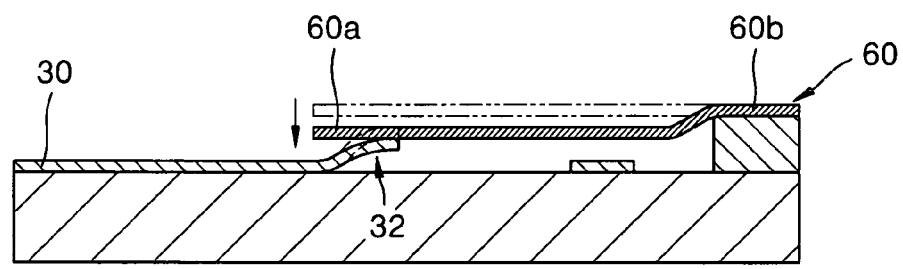
FIG. 13 is a sectional view for explaining the MEMS switch of FIG. 12.

FIGS. 12 and 13 illustrates another embodiment of an RF MEMS switch obtained from the RF MEMS switch described in FIGS. 10 and 11. Referring to FIGS. 12 and 13, the MEMS switch includes a curved contact unit 32 formed as a flip spring, instead of the dome-shape contact unit. As shown in FIGS. 12 and 13, the structure of the MEMS switch is the same as that of the MEMS switch shown in FIGS. 10 and 11, except for the shape of the contact unit 32. In this case, since the beam 60 is formed as a cantilever and the contact unit 32 is also formed as a cantilever, the MEMS switch can be operated using a small electrostatic force.

Figure 14:
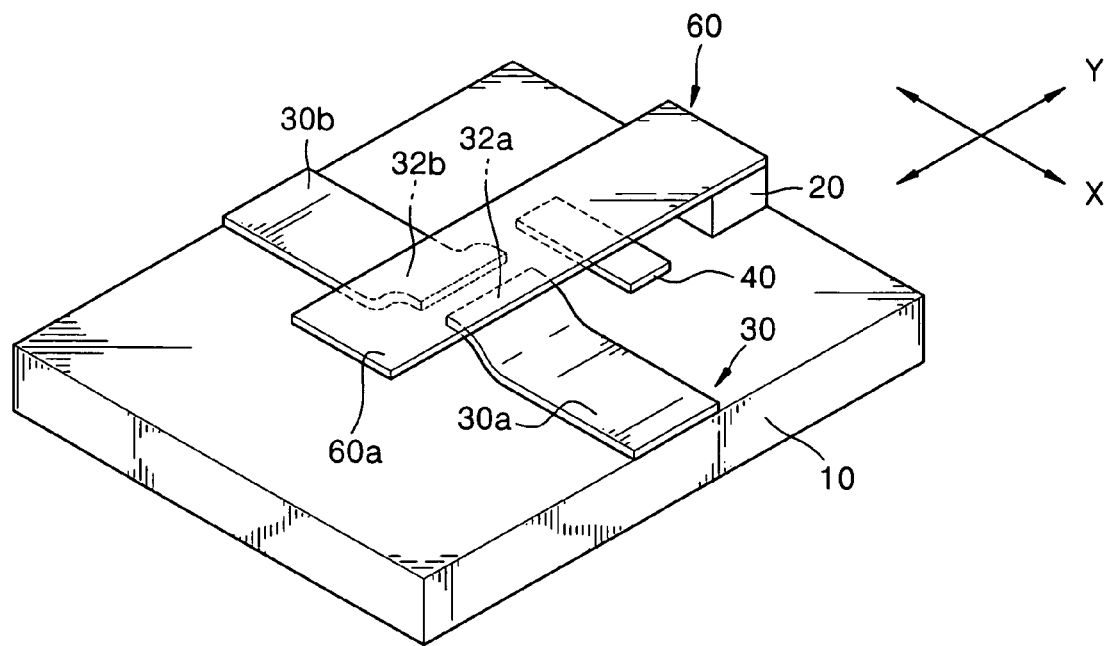
FIG. 14 is a perspective view illustrating an MEMS switch according to a ninth embodiment of the present invention.
Figure 15:
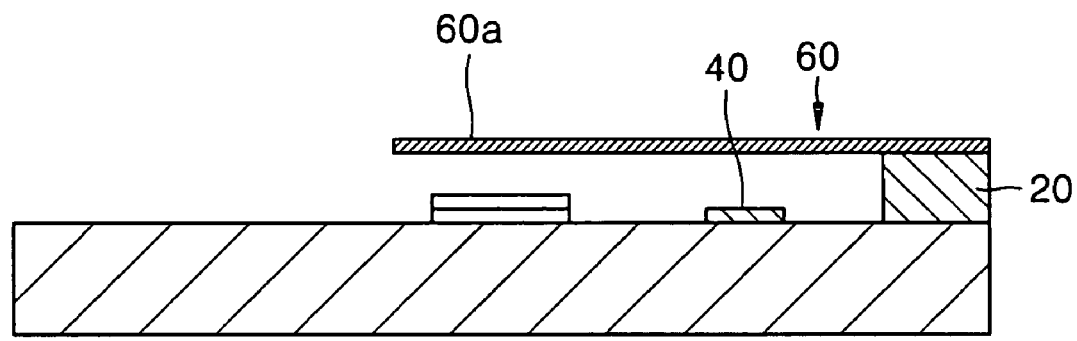
FIG. 15 is a sectional view illustrating the MEMS switch of FIG. 14.
Figure 16:
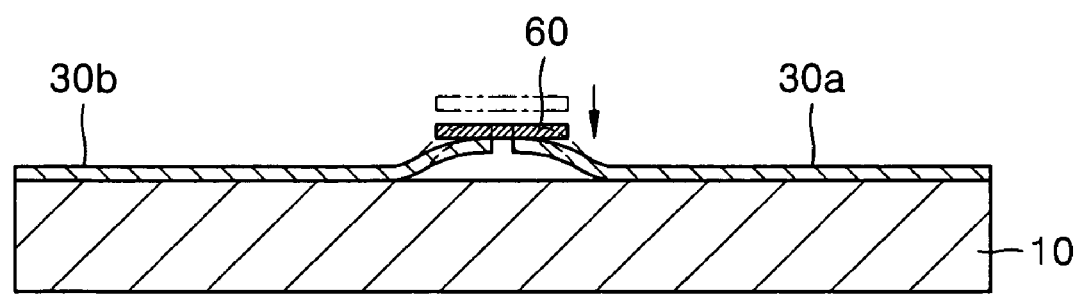
FIG. 16 is a sectional view for explaining the operation of the MEMS switch of FIG. 14.

FIGS. 14 through 16 illustrate another embodiment of an RF MEMS switch obtained from the RF MEMS switch described in FIGS. 7 through 9.

Referring to FIGS. 14 through 16, in a relay type switch, a signal line 30 is separated into an input unit 30a and an output unit 30b having curved contact units 32a and 32b, respectively. Here, the curved contact units 32a and 32b are curved while facing each other so that the curved contact units 32a and 32b are formed as flip springs. In addition, a free end 60a of a beam 60 is located above the contact units 32a and 32b, and a beam driving electrode 40 is located below the beam 60 apart from the free end 60a.

Thus, when a DC voltage is applied between the beam driving electrode 40 and the beam 60, the free end 60a of the beam 60 is attracted toward a substrate 10 due to an electrostatic force, and the free end 60a of the beam 60 contacts the contact units 32a and 32b, as shown in FIG. 16. Here, since the contact units 32a and 32b are elastically deformed, the contact units 32a and 32b are attached to the beam 60 with a proper pressure. Accordingly, an ohmic contact occurs between the contact units 32a and 32b and the beam 60, and the input unit 30a and the output unit 30b of the signal line 30 are electrically connected.

In this case, even when the beam 60 or the free end 60a of the beam 60 inclines to one side while not being parallel with the contact units 32a and 32b of the input unit 30a and the output unit 30b, or even when the contact units 32a and 32b of the input unit 30a and the output unit 30b are unbalanced, a stable ohmic contact may occur due to the elastic deformation of the contact units 32a and 32b.

In order to completely prevent the ohmic contact between the electrode 40 and the beam 60, a dielectric layer can be formed on the electrode 40 or a dielectric layer can be formed under the beam 60 corresponding to the electrode 40.

Figure 17A:
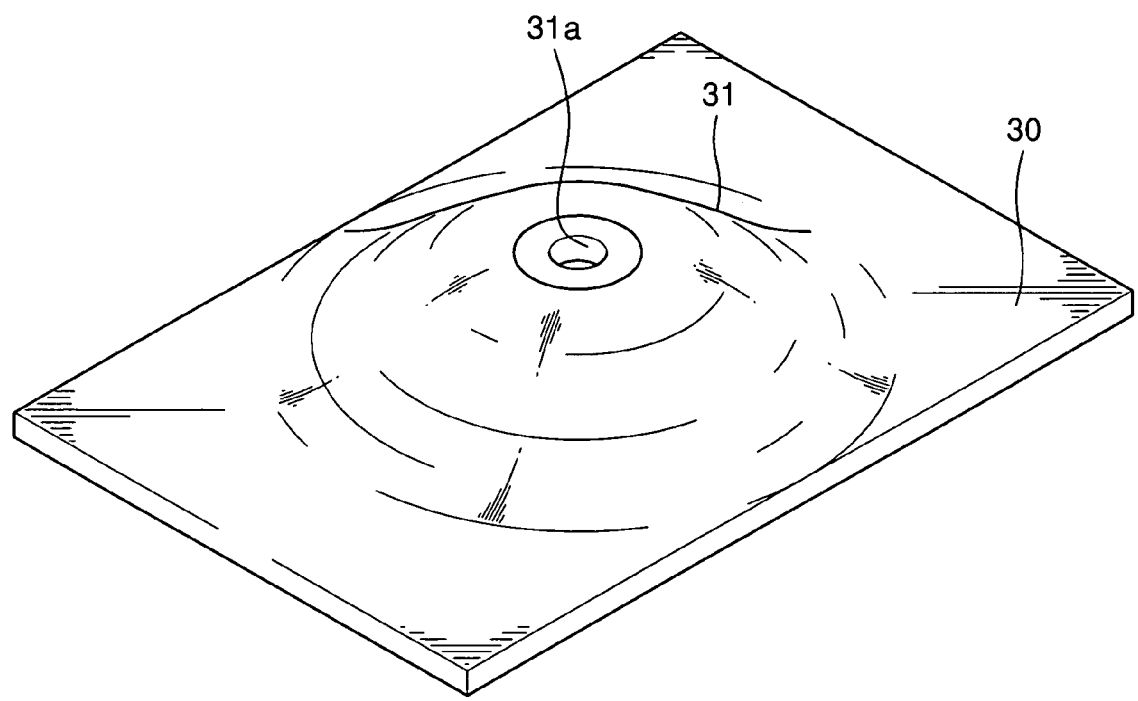
FIGS. 17A through 17C are perspective views illustrating contact portions of an RF MEMS switch according to the present invention.
Figure 17B:
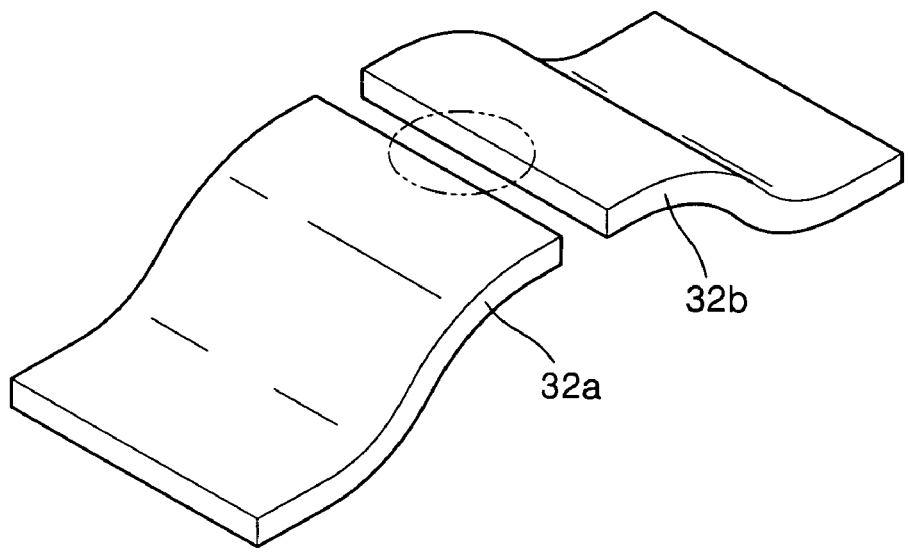
Figure 17C:
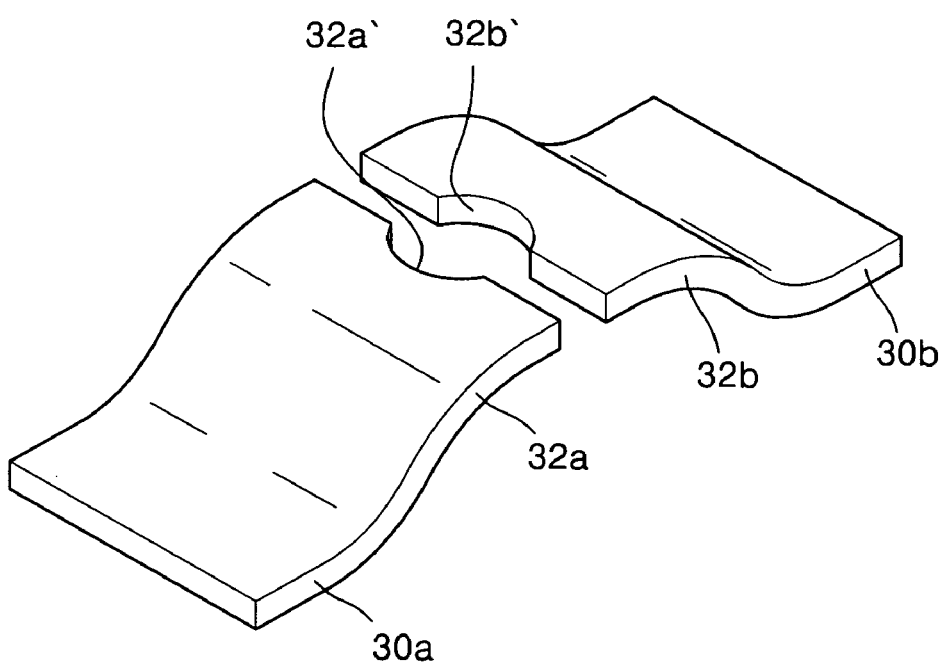

FIGS. 17A through 17C are perspective views illustrating contact portions of an RF MEMS switch according to the present invention.

FIG. 17A illustrates the dome-shape contact unit shown in FIGS. 4 through 6, and FIG. 17B illustrates the curved contact unit shown in FIGS. 7 through 9. FIG. 17C illustrates another example of the curved contact unit of FIG. 17B. Referring to FIG. 17C, arc shaped excision units 32a' and 32b' are formed at the center of the edges of the contact units 32a and 32b that face each other, in order to improve the elasticity of the contact units 32a and 32b. The shape of the contact units can be changed into various shapes.

A method of manufacturing the elastically deformable contact units and the signal line having the contact units will now be described.

An amorphous material layer is arranged under a contact unit, which is lifted from a substrate, or a layer, which supports the contact unit. After a catalyst layer is arranged under the amorphous material layer, a hole is formed in the catalyst layer. In this state, carbonic acid gas or hydrogen gas is supplied, so the contact unit is lifted from the substrate. The contact unit as a portion of the signal line can be lifted by the accumulation/expansion of the amorphous material layer and/or a byproduct of the reaction between the amorphous material layer and the catalyst layer, under the structure.

The method for forming the contact unit will now be described with reference to FIGS. 18A through 18D.

Figure 18A:
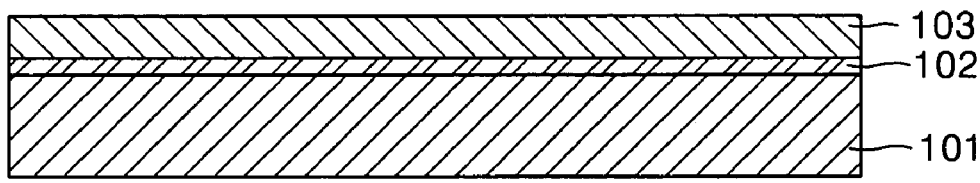
FIGS. 18A through 18D are sectional views illustrating a contact portion of a lifted structure in the MEMS switch according to the present invention.

Referring to FIG. 18A, a catalyst layer 102 is formed on a substrate 101. Here, the catalyst layer 102 can be formed of an Fe—Ni—Co alloy, i.e., Invar, including at least one material of Ni, Fe, and Cr. In addition, a Cr or Ni metal layer to be used as a signal line can be formed prior to the catalyst layer 102, under the catalyst layer 102. Thereafter, an amorphous material layer 103, for example, amorphous silicon (a-Si), is formed on the catalyst layer 102.

Figure 18B:
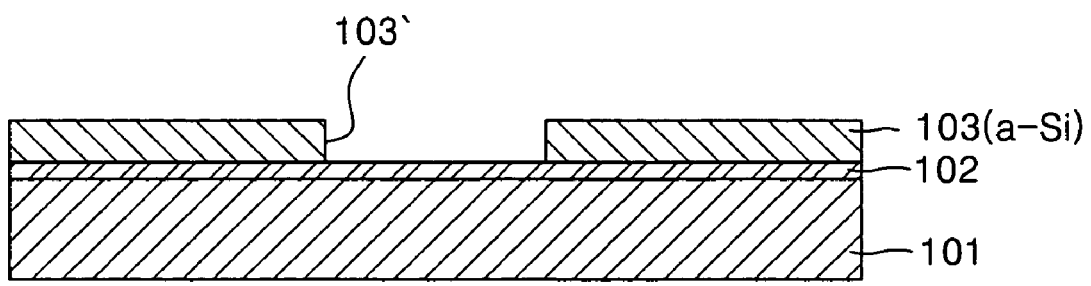

Referring to FIG. 18B, a through hole 103' is formed in the amorphous material layer 103. Here, the through hole 103' corresponds to the through hole that is formed at the top of the dome-shape contact unit.

Figure 18C:
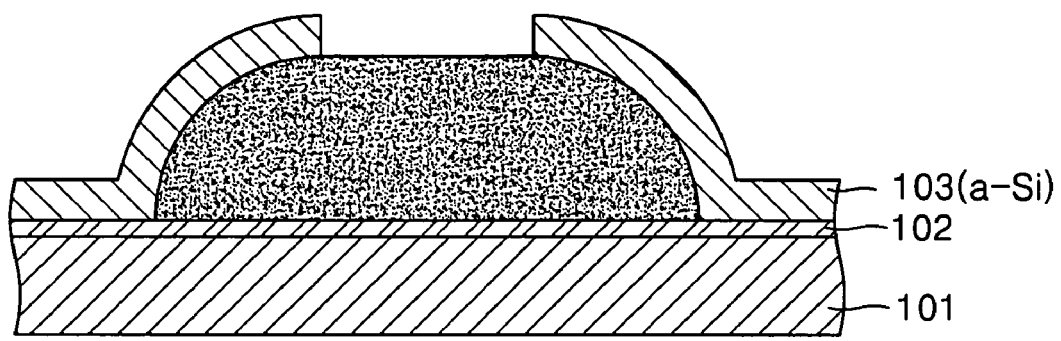

Referring to FIG. 18C, a reactant gas contacts the catalyst layer 102 through the through hole 103'. Here, the reactant gas can be a hot carbonic acid gas, more specifically, a carbon oxide gas of a predetermined ratio. By contacting the catalyst layer 102, a byproduct of the reactant gas, for example, amorphous carbon (a-C), is generated, accumulated, and expanded due to the reaction between the carbon oxide gas and hydrogen gas. Here, in order to efficiently generate a-C, the temperature of the resultant structure is increased to be higher than a predetermined temperature and the temperature of the resultant structure is reduced after a predetermined time. Here, the generation of a-C is necessary to obtain the elastic contact unit of the lifted structure.

Figure 18D:
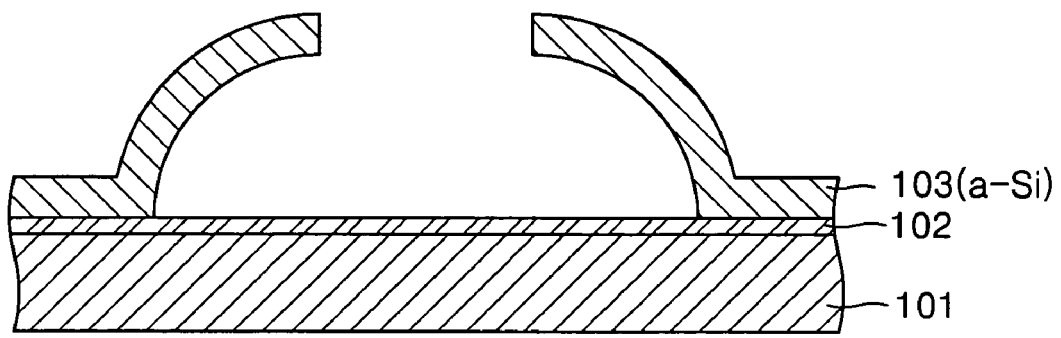

Thus, the amorphous material layer 103 of a-Si is formed into a dome-shape. Accordingly, when a-C is removed, the amorphous material layer 103 of dome-shape is obtained, as shown in FIG. 18D. Here, a-C can be removed by supplying hot hydrogen or oxygen plasma to oxidizing a-C into $CO_2$. In other cases, a-C can be removed using high temperature sintering or hydrogen plasma. The a-Si is doped with a proper impurity to become a conductive material, so the conductive a-Si can be used as a signal line or a contact unit.

Figure 19A:
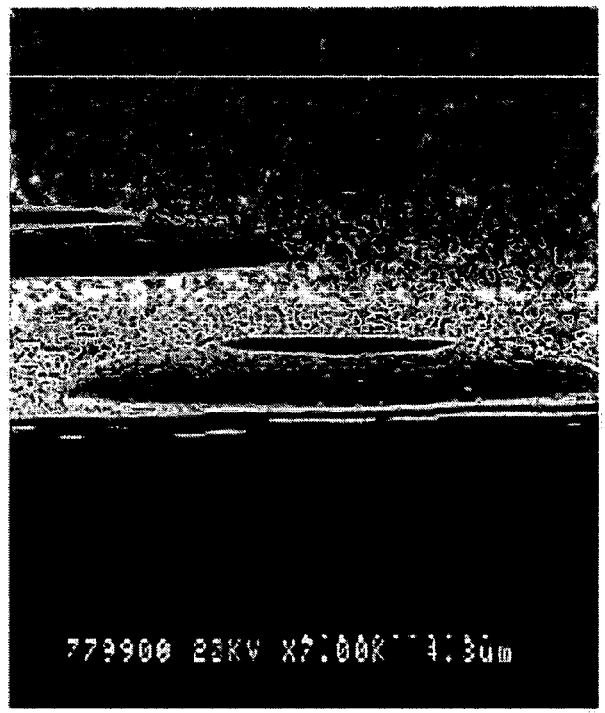
FIG. 19A is an SEM photograph illustrating the exterior of a dome-shape structure manufactured by forming amorphous carbon (a-C) according to the process of FIG. 18C.
Figure 19B:
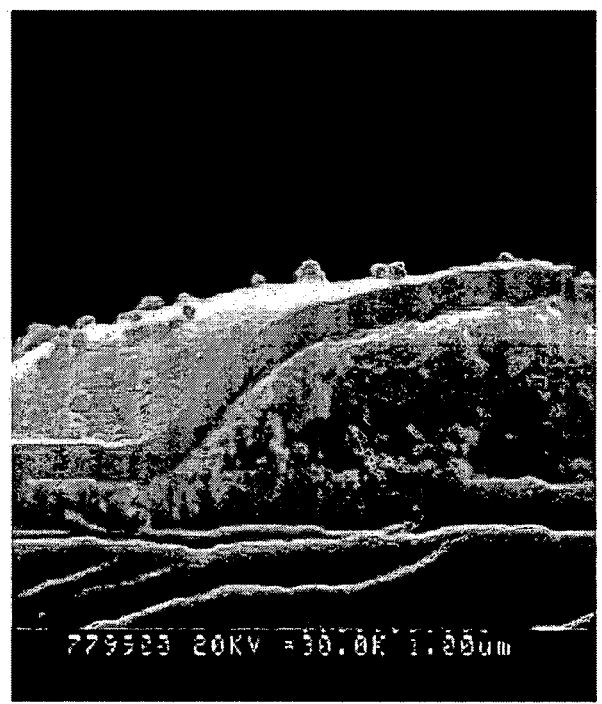
FIG. 19B is an SEM photograph illustrating a-C byproduct that is formed and accumulated in a dome-shape structure of FIG. 19A.
Figure 19C:
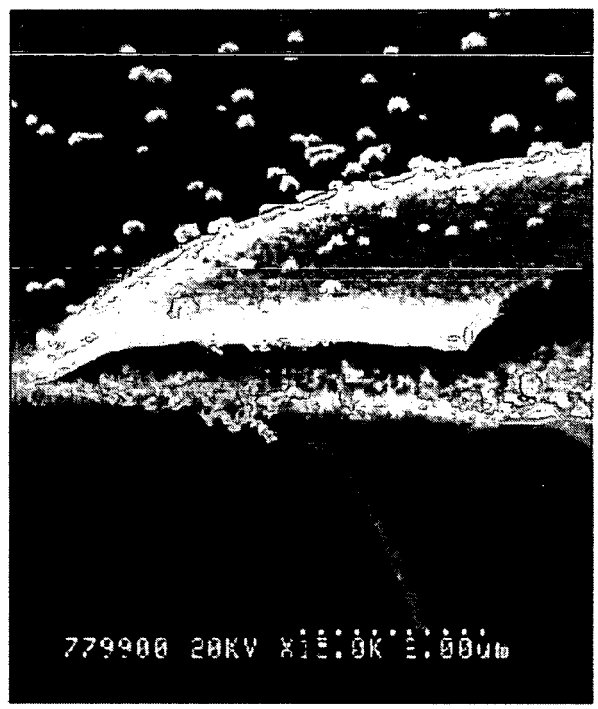
FIG. 19C is an SEM photograph illustrating the exterior of a dome-shape structure when a-C is removed using the process of FIG. 18D, i.e., oxygen plasma.
Figure 19D:
FIG. 19D is an SEM photograph illustrating a state where a-C is removed from the dome-shape structure of FIG. 19A.

FIG. 19A is an SEM photograph illustrating the exterior of the dome-shape structure manufactured by forming a-C according to the process of FIG. 18C. FIG. 19B is an SEM photograph illustrating a-C byproduct that is formed and accumulated in the dome-shape structure. FIG. 19C is an SEM photograph illustrating the exterior of the dome-shape structure when a-C is removed using the process of FIG. 18D, i.e., oxygen plasma. FIG. 19D is an SEM photograph illustrating a state where a-C is removed from the dome-shape structure. By etching the dome-shape structure into a predetermined pattern using photolithography, the contact unit of FIGS. 17A through 17C can be obtained.

FIGS. 20A through 20E are sectional views illustrating the manufacturing process of an MEMS switch according to the present invention.

Figure 20A:
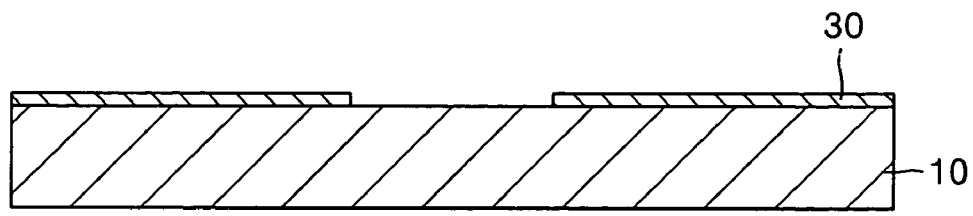
FIGS. 20A through 20E are sectional views illustrating an MEMS switch according to the present invention.

As shown in FIG. 20A, a metal layer of Cr or Ni is formed on a substrate 10, and the metal layer is patterned to form signal lines 30 that are separated into two sections. The signal line 30 can be patterned at the initial state or when patterning an amorphous material layer.

Figure 20B:
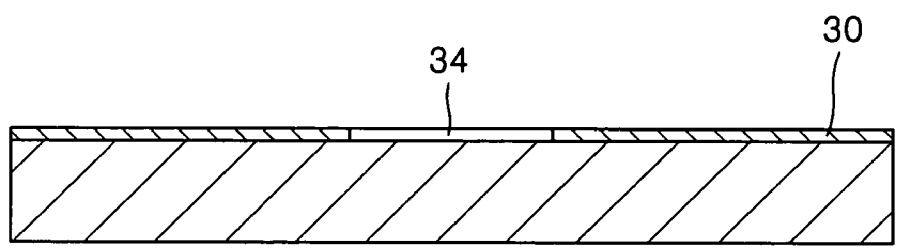

As shown in FIG. 20B, a catalyst layer 34 is formed between the signal lines 30 at the center of the substrate 10 or to cover the signal lines 30. Here, the catalyst layer 30 can be formed into a desired shape by a lift off method using a photomask.

Figure 20C:
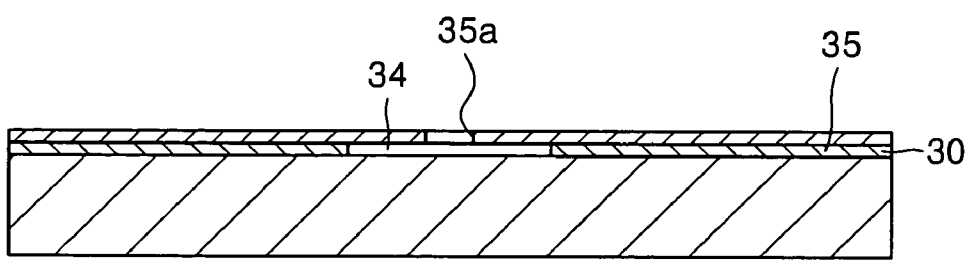

Referring to FIG. 20C, an amorphous material, for example, a-Si 35, is blanket deposited on the resultant structure by a CVD method. Thereafter, a through hole 35a corresponding to an area between the signal lines 30 is formed.

Figure 20D:
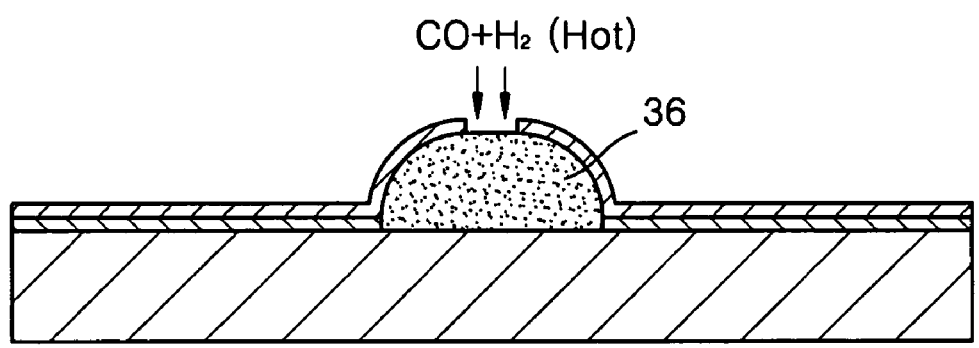

Referring to FIG. 20D, hot carbon oxide gas or hydrogen gas is supplied through the through hole 35a using a CVD apparatus, so the catalyst layer 34 reacts with the amorphous silicon 35. Thus, a byproduct, i.e., a-C 36, is generated under the a-Si 35. When the hot carbon monoxide and hydrogen gas is continuously supplied, the portion around the through hole 35a is lifted off to form a dome shape.

Figure 20E:
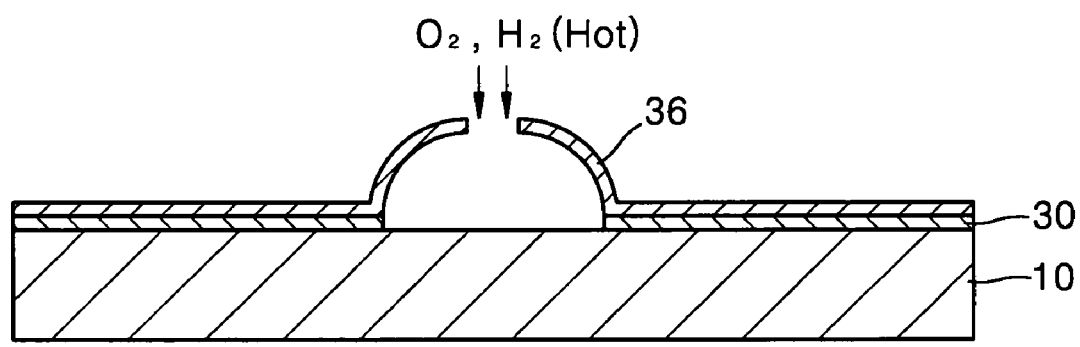

Referring to FIG. 20E, by supplying hydrogen or oxygen plasma through the through hole 35a, a-C that is present under the through hole 35a is removed. By removing a-C that has been accumulated under a-Si 35, dome-shape a-Si, i.e., the contact unit of the MEMS switch according to the present invention, can be obtained.

After forming the dome-shape structure, the a-Si is patterned into a desired shape using a photolithography method to complete the signal line having the contact unit of the desired shape. Thus, the signal line is formed into a dual structure consisting of a metal layer and an a-Si layer. In addition, the contact unit is formed of a-Si. In this case, the conductive a-Si can be obtained by implanting impurities. When necessary, an additional metal layer can be formed on the a-Si, in order to improve conductivity.

Next, a beam located above the contact unit and spacers supporting the beam are formed by conventional methods to complete the RF MEMS switch, for example, the MEMS switch of FIG. 7.

As described above, according to the present invention, stability of the contact between the contact unit and the beam is improved. In particular, even when the beam or the contact unit under the beam is unbalanced, the contact unit can elastically contact the beam to obtain a stable electrical switching operation. In addition, the beam is prevented from sticking to the lower structure because the contact unit under the beam is formed in a three-dimensional structure, such as dome or curve.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A microelectro mechanical system (MEMS) switch comprising:
   a substrate;
   a signal line formed on the substrate;
   a beam deformed by an electrostatic force to electrically switch with the signal line; and
   a spring type contact unit formed on the signal line to electrically contact the beam and elastically deformed by an external force wherein the contact unit is formed of amorphous silicon.

2. A microelectro mechanical system (MEMS) switch comprising:
   a substrate;
   a signal line formed on the substrate;
   a beam deformed by an electrostatic force to electrically switch with the signal line; and
   a spring type contact unit formed on the signal line to electrically contact the beam and elastically deformed by an external force wherein the contact unit is formed as a curved flip spring.

3. The MEMS switch of claim 2, wherein a rear end of the beam is fixed by a spacer formed on the substrate, and a front end of the beam is located above the contact unit of the signal line.

4. The MEMS switch of claim 2, wherein the contact unit includes two curved flip springs formed into an arch shape having end units.

5. The MEMS switch of claim 2, wherein the beam is suspended by spacers that support the beam by being formed at both sides of the beam.

6. The MEMS switch of claim 5, wherein the beam is arranged to be perpendicular to the signal line, and beam driving electrodes are arranged under the beam and at the both sides of the signal line.

7. The MEMS switch of claim 5, wherein dielectric layers are formed on beam driving electrodes.

8. A microelectro mechanical system (MEMS) switch comprising:
   a substrate;
   a signal line formed on the substrate;
   a beam deformed by an electrostatic force to electrically switch with the signal line; and
   a spring type contact unit formed on the signal line to electrically contact the beam and elastically deformed by an external force wherein the content unit is a dome-shape contact unit and a through hole is formed at a top portion of a dome-shape contact unit.

9. The MEMS switch of claim 8, wherein the beam is arranged to be perpendicular to the signal line, and beam driving electrodes are arranged under the beam and at the both sides of the signal line.

10. The MEMS switch of claim 8, wherein dielectric layers are formed on the beam driving electrodes.

11. The MEMS switch of claim 8, wherein a rear end of the beam is fixed by a spacer formed on the substrate, and a front end of the beam is located above the contact unit of the signal line.

12. An MEMS switch comprising:
    a substrate;
    first and second signal lines formed on the substrate while the ends of the signal lines are adjacent;
    a beam deformed by electrostatic force to electrically contact the first and second signal lines; and
    spring type contact units arranged at both ends of the signal lines to electrically connect to the beam and electrically deformed by an external force.

13. The MEMS switch of claim 12, wherein the contact units formed at the both ends of the first and second signal lines are formed as curved flip springs.

14. The MEMS switch of claim 12, wherein the contact units are formed of amorphous silicon.

15. The MEMS switch of claim 12, wherein the beam is suspended by spacers that support the beam by being formed at both sides of the beam.

16. The MEMS switch of claim 15, wherein the beam is arranged to be perpendicular to the first and second signal lines, and beam driving electrodes are arranged under the beam and at the both sides of the signal lines.

17. The MEMS switch of claim 16, wherein dielectric layers are formed on the beam driving electrodes.

18. The MEMS switch of claim 12, wherein a rear end of the beam is fixed by a spacer formed on the substrate, and a front end of the beam is located above the contact units of the first and second signal lines.

* * * * *